(12) United States Patent
Chang et al.

(10) Patent No.: US 9,934,928 B2
(45) Date of Patent: Apr. 3, 2018

(54) SOURCE HOUSING ASSEMBLY FOR CONTROLLING ION BEAM EXTRACTION STABILITY AND ION BEAM CURRENT

(71) Applicant: Varian Semiconductor Equipment Associates, Inc., Gloucester, MA (US)

(72) Inventors: Shengwu Chang, South Hamilton, MA (US); Jeff Burgess, Manchester, MA (US); William Leavitt, Haverill, MA (US); Michael St Peter, Gloucester, MA (US); Matt Mosher, Gloucester, MA (US); Joe Olson, Beverly, MA (US); Frank Sinclair, Boston, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 104 days.

(21) Appl. No.: 14/713,573

(22) Filed: May 15, 2015

(65) Prior Publication Data

US 2016/0336138 A1    Nov. 17, 2016

(51) Int. Cl.
*H01J 37/08*    (2006.01)
*H01J 27/08*    (2006.01)
(Continued)

(52) U.S. Cl.
CPC ............... *H01J 27/08* (2013.01); *H01J 3/04* (2013.01); *H01J 5/02* (2013.01); *H01J 9/18* (2013.01);
(Continued)

(58) Field of Classification Search
CPC .. H01J 37/317; H01J 37/3171; H01J 37/3172; H01J 27/024; H01J 27/08;
(Continued)

(56) References Cited

U.S. PATENT DOCUMENTS 5,252,892 A * 10/1993 Koshiishi ................ H01J 27/20
                                                        250/423 R
6,022,258 A *  2/2000 Abbott ..................... H01J 27/04
                                                        445/49
(Continued)

OTHER PUBLICATIONS

International Search Report and Written Opinion dated Jul. 28, 2016, in corresponding PCT/US2016/031752.

*Primary Examiner* — Christopher Raabe

(57) ABSTRACT

Provided herein are approaches for improving ion beam extraction stability and ion beam current for an ion extraction system. In one approach, a source housing assembly may include a source housing surrounding an ion source including an arc chamber, the source housing having an extraction aperture plate mounted at a proximal end thereof. The source housing assembly further includes a vacuum liner disposed within an interior of the source housing to form a barrier around a set of vacuum pumping apertures. As configured, openings in the source housing assembly, other than an opening in the extraction aperture plate, are enclosed by the extraction aperture plate and the vacuum liner, thus ensuring appendix arcs or extraneous ions produced outside the arc chamber remain within the source housing. Just those ions produced within the arc chamber exit the source housing through the opening of the extraction aperture plate.

20 Claims, 7 Drawing Sheets

(51) Int. Cl.
  *H01J 27/02* (2006.01)
  *H01J 9/18* (2006.01)
  *H01J 9/385* (2006.01)
  *H01J 3/04* (2006.01)
  *H01J 5/02* (2006.01)

(52) U.S. Cl.
  CPC ............ *H01J 9/385* (2013.01); *H01J 27/024* (2013.01); *H01J 37/08* (2013.01)

(58) Field of Classification Search
  CPC .. H01J 9/385; H01J 37/08; H01J 37/04; H01J 5/02
  USPC ............................................................ 313/7
  See application file for complete search history.

(56) References Cited

U.S. PATENT DOCUMENTS

| | | | |
|---|---|---|---|
| 2003/0183780 A1 | 10/2003 | Sano et al. | |
| 2003/0234372 A1 | 12/2003 | Park | |
| 2009/0211896 A1* | 8/2009 | Devaney | H01J 27/08 204/192.11 |
| 2009/0236547 A1* | 9/2009 | Huang | H01J 37/20 250/492.21 |
| 2009/0314962 A1 | 12/2009 | Dorai et al. | |
| 2010/0155619 A1 | 6/2010 | Koo et al. | |
| 2010/0327159 A1 | 12/2010 | Platow et al. | |
| 2014/0062286 A1* | 3/2014 | Sato | H01J 27/08 313/231.41 |
| 2014/0175301 A1* | 6/2014 | Gierak | H01J 37/08 250/397 |
| 2014/0353518 A1* | 12/2014 | Sato | H01J 27/024 250/424 |

\* cited by examiner

SOURCE HOUSING ASSEMBLY FOR CONTROLLING ION BEAM EXTRACTION STABILITY AND ION BEAM CURRENT

FIELD OF THE DISCLOSURE

The disclosure relates generally to the field of semiconductor device fabrication, and more particularly to a source housing assembly for controlling ion beam extraction stability and ion beam current for an ion extraction system.

BACKGROUND OF THE DISCLOSURE

In semiconductor manufacturing, ion implantation is a common technique for altering properties of semiconductor wafers during the production of various semiconductor-based products. Ion implantation may be used to introduce conductivity-altering impurities (e.g., dopant implants), to modify crystal surfaces (e.g., pre-amorphization), to created buried layers (e.g., halo implants), to create gettering sites for contaminants, and to create diffusion barriers (e.g., fluorine and carbon co-implant). Also, ion implantation may be used in non-transistor applications such as for alloying metal contact areas, in flat panel display manufacturing, and in other surface treatment. All of these ion implantation applications may be classified, generally, as forming a region of material property modification.

Ion extraction systems often include an ion source having an arc chamber, a source housing, and suppression and ground electrodes. An extraction aperture is positioned adjacent the ion source, and the source body, an arc chamber base and the arc chamber are loosely assembled together, wherein the extraction aperture is a part of the arc chamber. In this configuration, the extraction aperture may shift as much as +/−1.5 mm following, for example, routine maintenance to the ion extraction system. As a result, beam setup parameters of each beam-line component need to be adjusted to compensate for the shift of the extraction aperture, causing beam transport loss in addition to increasing the beam tuning time. Unfortunately, both a beam tuning time increase and a beam transport loss reduces the production throughput of the ion extraction system.

Furthermore, conventional ion extraction systems may produce an appendix arc outside the arc chamber as a by-product of the filament, the arc voltage, and the bias voltage present. This appendix arc is not sustainable to the extraction, and exists in a periodic manner. As a result, the ion beam extracted from the appendix arc exits the source housing and damages the suppression and ground electrodes adjacent the source housing, causing ion beam glitches. The ion beam glitches negatively impact beam extraction stability and beam current of the ion extraction system.

SUMMARY

In view of the foregoing, to provide a system and method for improving ion beam extraction stability and ion beam current for an ion extraction system would be advantageous. In one approach, openings in a source housing of the ion extraction system surrounding an arc chamber, other than an opening formed in an extraction aperture plate, are bounded by the extraction aperture plate and a vacuum liner, thus ensuring appendix arcs and extraneous ions produced outside of the arc chamber remain enclosed within the source housing. Just those ions generated within the arc chamber may exit the source housing through the opening of the extraction aperture plate. As a result, appendix arcs are unable to strike and damage the suppression and ground electrodes adjacent the source housing, thus decreasing the number of ion beam glitches.

It would further be advantageous to provide a system and method for providing an extraction aperture plate as part of the source housing to enable an opening of the extraction aperture plate to be positioned more accurately, reducing subsequent adjustments to the source housing following a source maintenance cycle, for example. Accurate positioning of the opening of the extraction aperture plate ensures more uniform beam optics from one source maintenance cycle to the next, thus reducing beam setup/tuning time and resultant beam transport loss.

An exemplary source housing assembly in accordance with the present disclosure may include a source housing including a distal end and a proximal end, an ion source including an arc chamber disposed within the source housing, and an extraction aperture plate mounted to the distal end of the source housing, the extraction aperture plate extending over an opening in the source housing defined by the interior of the source housing at the distal end, and the extraction aperture plate having an opening substantially aligned with an aperture of the arc chamber.

An exemplary ion extraction system in accordance with the present disclosure may include a source housing including a set of vacuum pumping apertures formed therein, and an ion source including an arc chamber disposed within the source housing. The ion extraction system may further include a vacuum liner disposed within an interior of the source housing, the vacuum liner forming a barrier between the set of vacuum pumping apertures and the ion source. The ion extraction system may further include an extraction aperture plate mounted to the distal end of the source housing, the extraction aperture plate extending over an opening in the source housing defined by the interior of the source housing at the distal end, and the extraction aperture plate having an opening substantially aligned with an aperture of the arc chamber.

An exemplary method in accordance with the present disclosure may include providing a source housing defining a distal end and a proximal end, and mounting an extraction aperture plate to the distal end of the source housing, the extraction aperture plate extending over an opening in the source housing defined by the interior of the source housing at the distal end, and the extraction aperture plate having an opening substantially aligned with an aperture of the arc chamber. The method may further include providing a vacuum liner within an interior of a source housing, the vacuum liner forming a barrier around a set of vacuum pumping apertures of the source housing.

Figure 1:
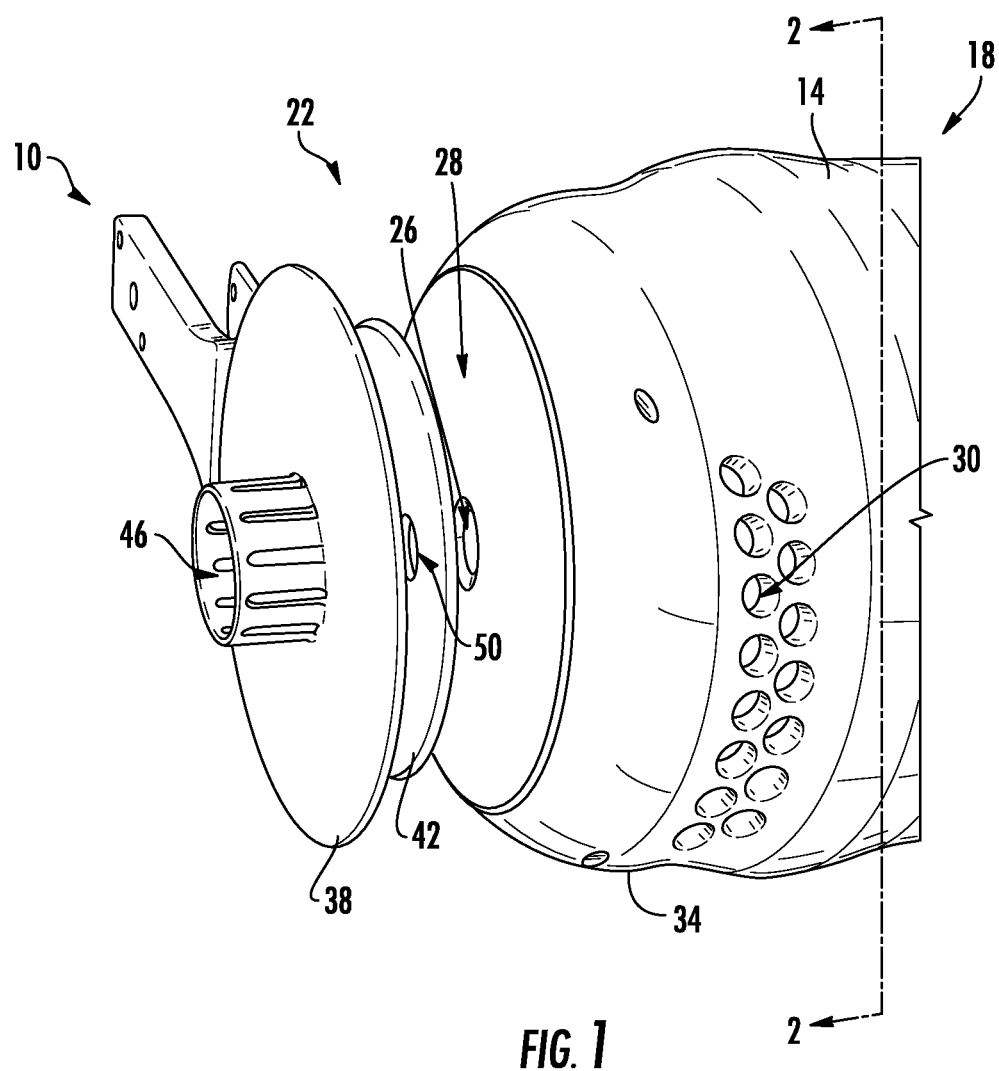
FIG. 1 is an isometric view illustrating an ion extraction system in accordance with the present disclosure.

The drawings are not necessarily to scale. The drawings are merely representations, not intended to portray specific parameters of the disclosure. The drawings are intended to depict typical embodiments of the disclosure, and therefore should not be considered as limiting in scope. In the drawings, like numbering represents like elements.

DETAILED DESCRIPTION

A system and method in accordance with the present disclosure will now be described more fully hereinafter with reference to the accompanying drawings, where embodiments of the system and method are shown. The system and method, however, may be embodied in many different forms and should not be construed as being limited to the embodiments set forth herein. Rather, these embodiments are provided so this disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of these components and their constituent parts, each with respect to the geometry and orientation of a component of a semiconductor manufacturing device as appearing in the figures. Said terminology will include the words specifically mentioned, derivatives thereof, and words of similar import.

As used herein, an element or operation recited in the singular and proceeded with the word "a" or "an" should be understood as not excluding plural elements or operations, unless such exclusion is explicitly recited. Furthermore, references to "one embodiment" of the present disclosure are not intended to be interpreted as excluding the existence of additional embodiments also incorporating the recited features.

As stated above, provided herein are approaches for improving ion beam extraction stability and ion beam current for an ion extraction system by reducing the number of ion beam glitches. In one approach, a source housing assembly may include a source housing surrounding an ion source, where the ion source includes an arc chamber, the source housing having an extraction aperture plate mounted at a proximal end thereof. The source housing assembly further includes a vacuum liner disposed within an interior of the source housing to form a barrier around a set of vacuum pumping apertures. As configured, openings in the source housing assembly, other than an opening in the extraction aperture plate, are enclosed by the extraction aperture plate and the vacuum liner, thus ensuring appendix arcs or extraneous ions produced outside the arc chamber remain within the source housing. Just those ions produced within the arc chamber exit the source housing through the opening of the extraction aperture plate.

Referring now to FIG. 1, an exemplary embodiment demonstrating an ion extraction system 10 (hereinafter "system 10") in accordance with the present disclosure is shown. The system 10 includes a source housing 14 defining a proximal end 18 and a distal end 22. Disposed at the distal end 22 is an extraction aperture plate 28, where the extraction plate 28 includes a single primary opening 26 formed therein. The source housing 14 further includes a set of vacuum pumping apertures 30 formed through a sidewall 34 of the source housing to enable vacuum pumping of the interior of the source housing 14 by a pump (not shown).

As shown, the system 10 further includes a ground electrode 38 and a suppression electrode 42 each having an opening (shown as 46 and 50, respectively) aligned with the opening 26. In some approaches, the ground electrode 38 is provided to restrict the penetration of electric fields between the ground electrode 38 and an ion source within the source housing 14 into an area downstream of the ground electrode 38. Meanwhile, the suppression electrode 42 operates to prevent electron in the ion beam downstream of the ground electrode 38 from being drawn into the ion source within the source housing 14.

Figure 2:
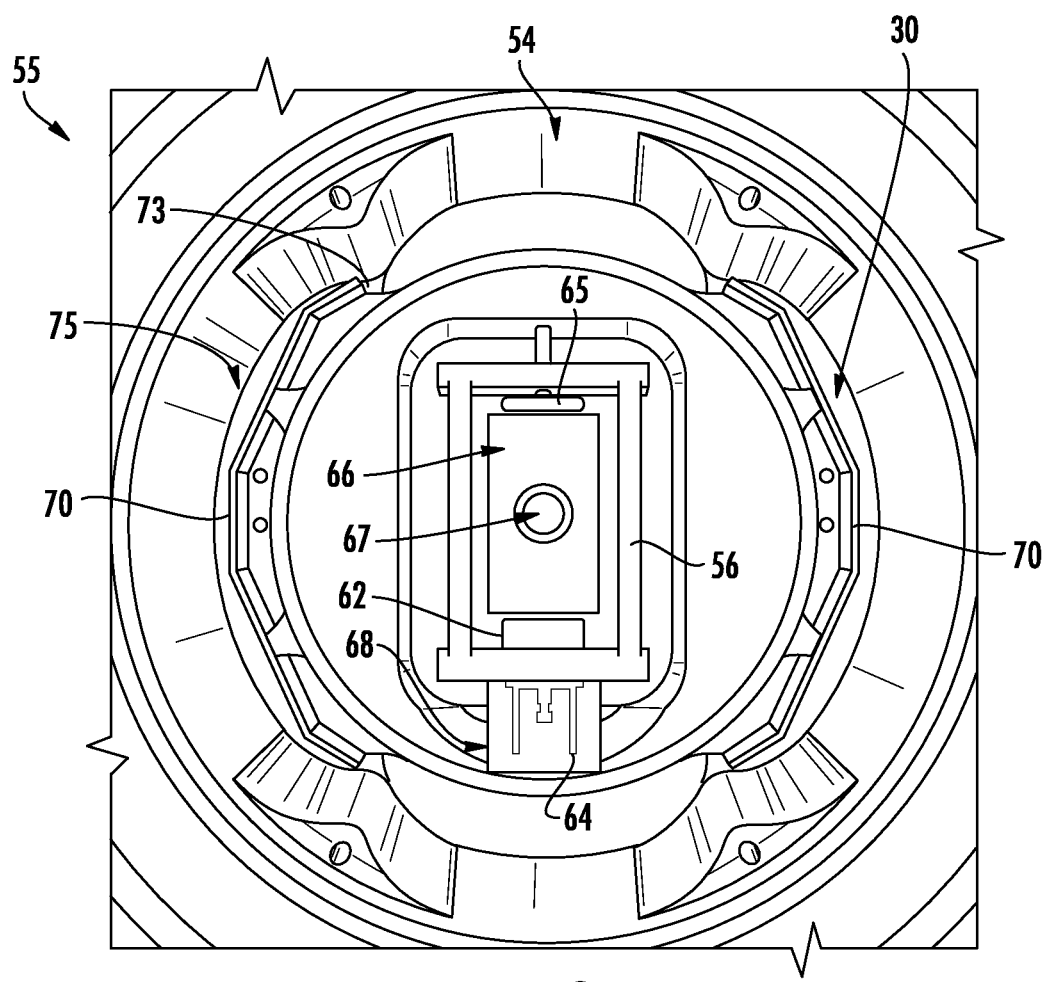
FIG. 2 is a cross-sectional view illustrating an interior of the ion extraction system shown in FIG. 1.
Figure 3:
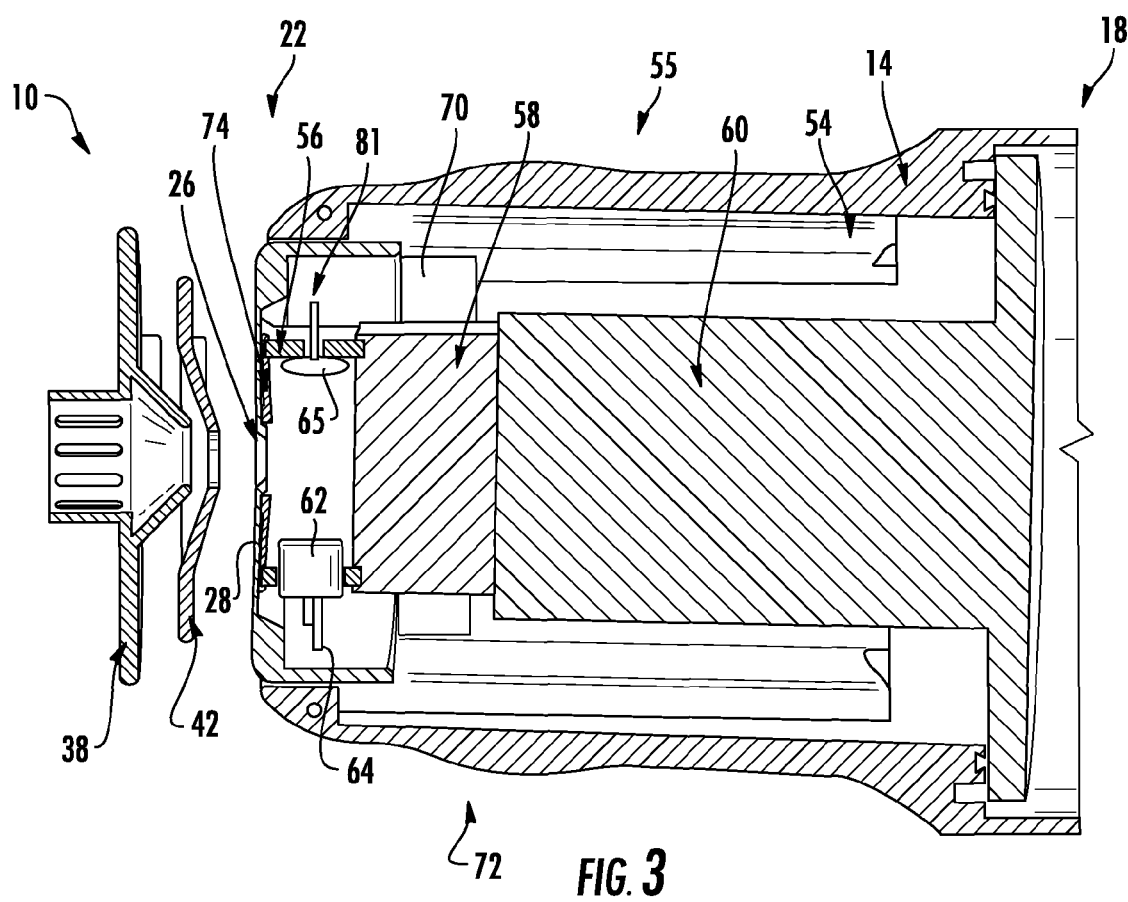
FIG. 3 is a side cross-sectional view illustrating the ion extraction system shown in FIG. 1.

Referring now to FIGS. 2-3, an interior 54 of the source housing 14 according to exemplary embodiments will be described in greater detail. As shown, a source housing assembly 55 of the system 10 includes the source housing 14, an arc chamber 56 coupled to an arc base 58, and an ion source body 60 coupled to the arc base 58. The arc chamber 56, the arc base 58, and the ion source body 60 are disposed within the source housing 14 and together generate a beam of ions for implantation into a target such as a semiconductor wafer.

In one non-limiting embodiment, the arc chamber 56 includes a cathode 62, where the cathode 62 emits electrons, e.g., by thermionic emission, and accelerates the electron to an anode. Some of these electrons collide with and ionize gas atoms or molecules. Secondary electrons from these collisions can be accelerated toward the anode to energies depending on the potential distribution and the starting point of the electron. Ions can be extracted through the anode, perpendicular to the anode, or through the cathode area depending upon the type of source.

The cathode 62 may include a filament 64 at one end of the arc chamber 56, where the arc chamber 56 is opposite a repeller 65 at the other end. Electrons from the cathode 62 are confined inside the anode cylinder by the magnetic field and can oscillate between the filament 64 and the repeller 65 resulting in a high ionization efficiency.

During use, the arc chamber 56 generates a primary arc 66, as well as an appendix arc 68. The primary arc 66 is produced inside the arc chamber 56, and the ion beam is extracted from the primary arc 66 through an extraction aperture 67 of the arc chamber 56. The appendix arc 68 is produced outside the arc chamber 56 as a by-product due to the filament 64 and the arc voltage/bias voltage existing in the area.

As also shown in FIGS. 2-3, the source housing assembly 55 further includes a vacuum liner 70 disposed within the interior 54 of the source housing 14. In an exemplary embodiment, the vacuum liner 70 is positioned adjacent the vacuum pumping apertures 30 so a barrier is formed between the interior 54 of the source housing 14 and an area 72 surrounding the source housing 14. In one non-limiting embodiment, the vacuum liner is a material able to withstand high temperature levels within the source housing 14, such as steel, and is formed as a generally arcuate element. The vacuum liner 70 is coupled to an interior surface 73 of the source housing using a weld, screws, rivets, etc. The vacuum liner 70 is configured to allow pumping of the interior 54 of the source housing, as the vacuum liner 70 is not flush with nor creates a seal with the interior surface 73 of the source housing 14 along an entire length of the vacuum liner 70. That is, a space 75 is provided between the vacuum liner 70 and the source housing 14 to allow for fluid communication between the interior 54 of the source housing 14 and the vacuum pumping apertures 30. At the same time, the vacuum liner 70 provides a barrier between the arc chamber 56 and the vacuum pumping apertures 30 to ensure the appendix arc 68 remains enclosed within the source housing 14.

Figure 4:
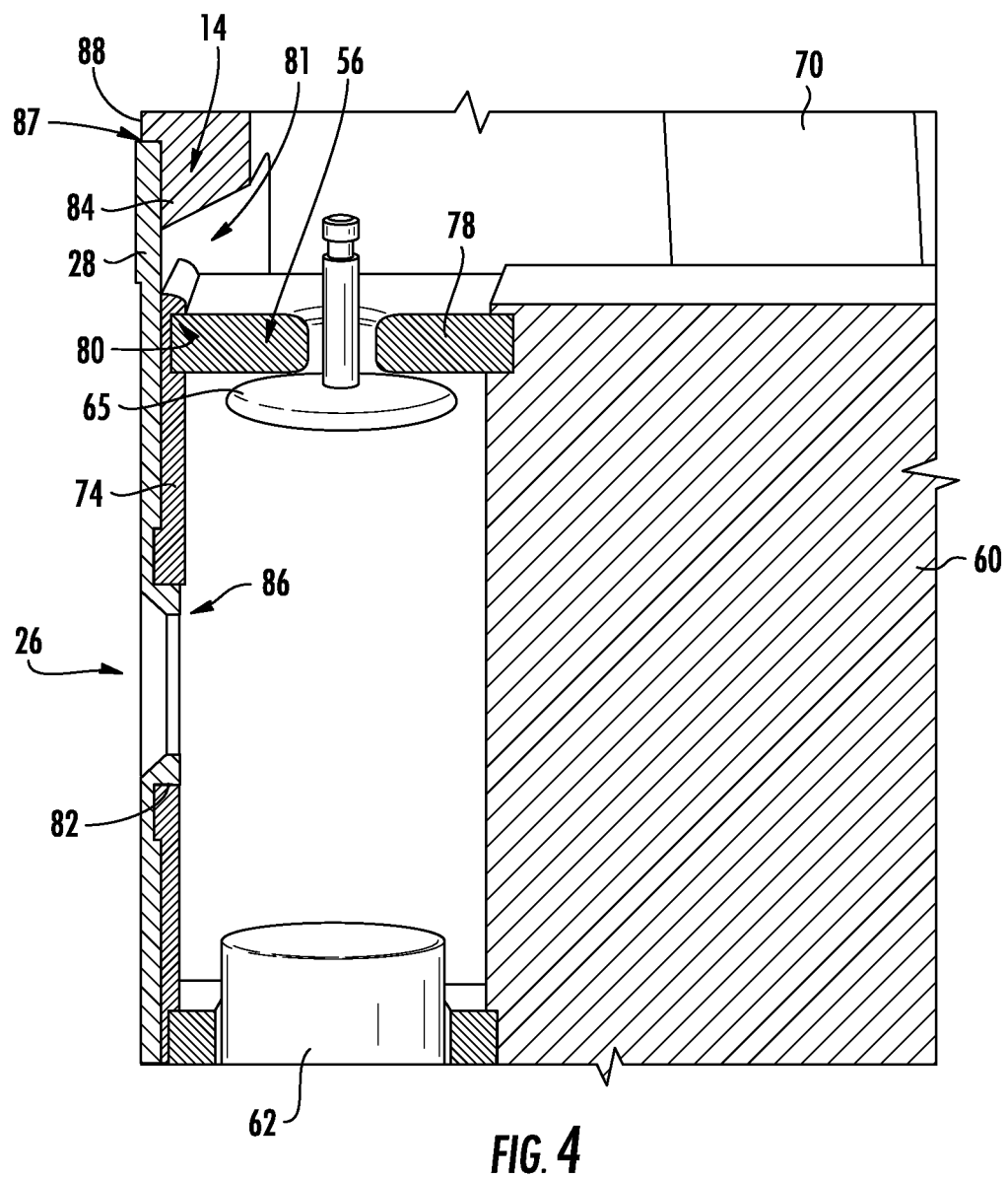
FIG. 4 is a side cross-sectional view illustrating the ion extraction system shown in FIG. 1.

Referring now to FIGS. 3-4, an extraction aperture liner 74 according to exemplary embodiments will be described in greater detail. As shown, the extraction aperture liner 74 surrounds the extraction aperture 67 of the arc chamber 56, as well as the opening 26 formed in the extraction aperture plate 28. In exemplary embodiments, the extraction aperture liner 74 is coupled to a distal side of the arc chamber 56, for example, via a press fit between a sidewall 78 of the arc chamber 56 and a recess 80 formed towards a perimeter of the extraction aperture liner 74.

The opening 26 in the extraction aperture plate 28 defines a radial extension 82 extending into an opening 86 of the extraction aperture liner 74. The radial extension 82 is dimensioned so the extraction aperture plate 28 is coupled to the extraction aperture liner 74, for example, via a press fit. In an exemplary embodiment, the opening 26 in the extraction aperture plate 28 is dimensioned similar to, or slightly larger (e.g., 15-20% greater diameter) than the dimension of extraction aperture 67. This enables extraction of the ion beam from the source housing 14, while also ensuring the appendix arc 68 (FIG. 2) and/or any extraneous ions remain contained within the source housing 14.

As configured, the extraction aperture plate 28 and the extraction aperture liner 74 together obstruct all openings in the front of the source housing assembly 55 at the distal end 22 other than the opening 26 of the extraction aperture plate 28. As a result, the appendix arc 68 remains enclosed within the source housing 14, and any ions produced outside the arc chamber 56 will be prevented from being extracted out of the source housing 14, thus improving both beam extraction stability and beam current. Just those ions produced inside the arc chamber 56 may be extracted out of the source housing 14 through the extraction aperture 67 of the arc chamber 56 and the opening 26 of the extraction aperture plate 28. Therefore, beam glitches resulting from the appendix arc 68 may be reduced.

Furthermore, as configured, the extraction aperture plate 28 and the extraction aperture liner 74 improve beam tuning time and reduce beam transport loss. Specifically, in one non-limiting embodiment, the extraction aperture plate 28 is coupled to the source housing 14 as an integral component. For example, as shown in FIG. 4, the extraction aperture plate 28 is positioned so the extraction plate abuts a shoulder section 84 within a recess 87 of the source housing 14. The extraction aperture plate 28 extends over an opening 81 in the source housing 14 defined by the interior of the source housing 14 at the distal end 22. The extraction aperture plate 28 can be secured to the source housing using any variety of approaches including, for example, a press fit. Once secured in place, the extraction aperture plate 28 is substantially flush with an end surface 88 of the source housing 14.

This configuration allows the extraction aperture plate 28 to be positioned more accurately, thus minimizing shifting of the opening 26 following testing or maintenance, for example. Accurate positioning of the opening 26 of the extraction aperture plate 28 ensures more consistent beam optics, reducing both beam tuning time and beam transport loss because the beam optics are less likely to need adjustment to compensate for an expected shift of the opening 26.

Figure 5:
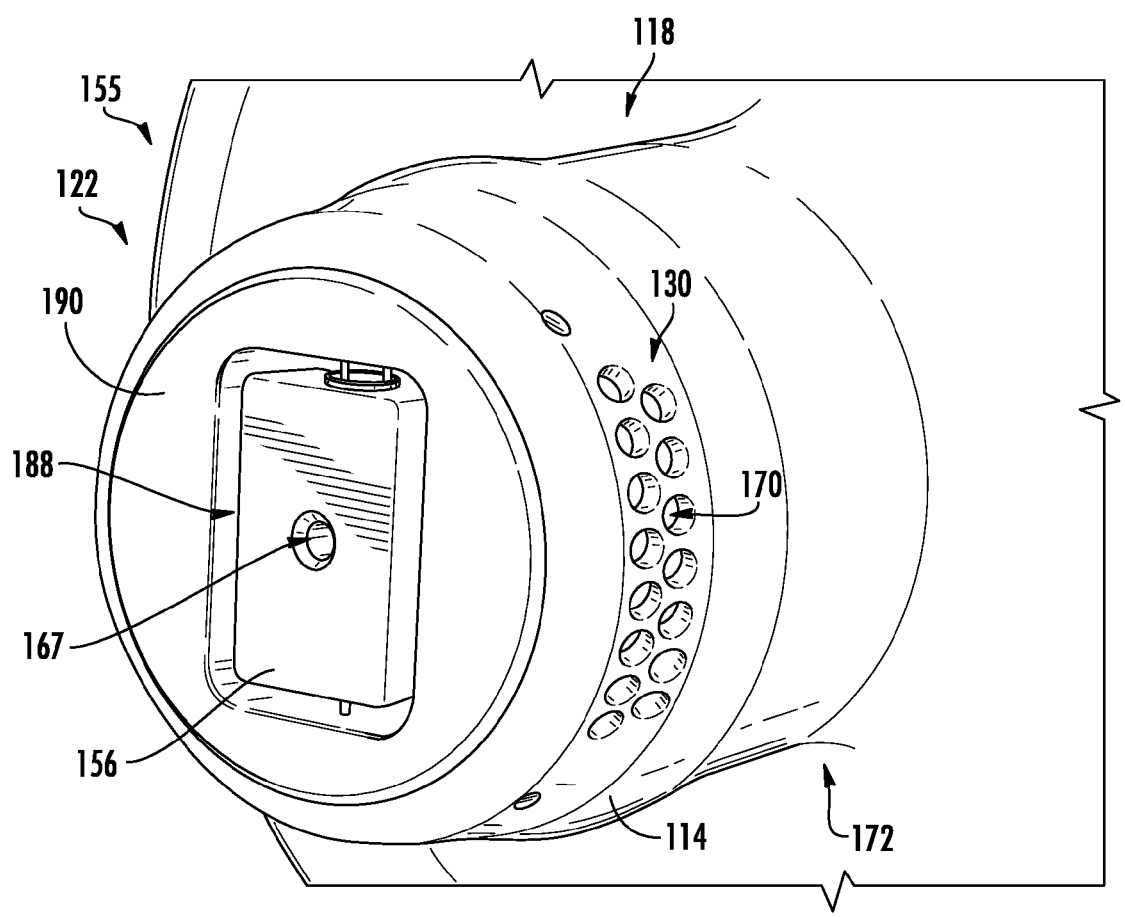
FIG. 5 is an isometric view illustrating a source housing assembly in accordance with the present disclosure.
Figure 6:
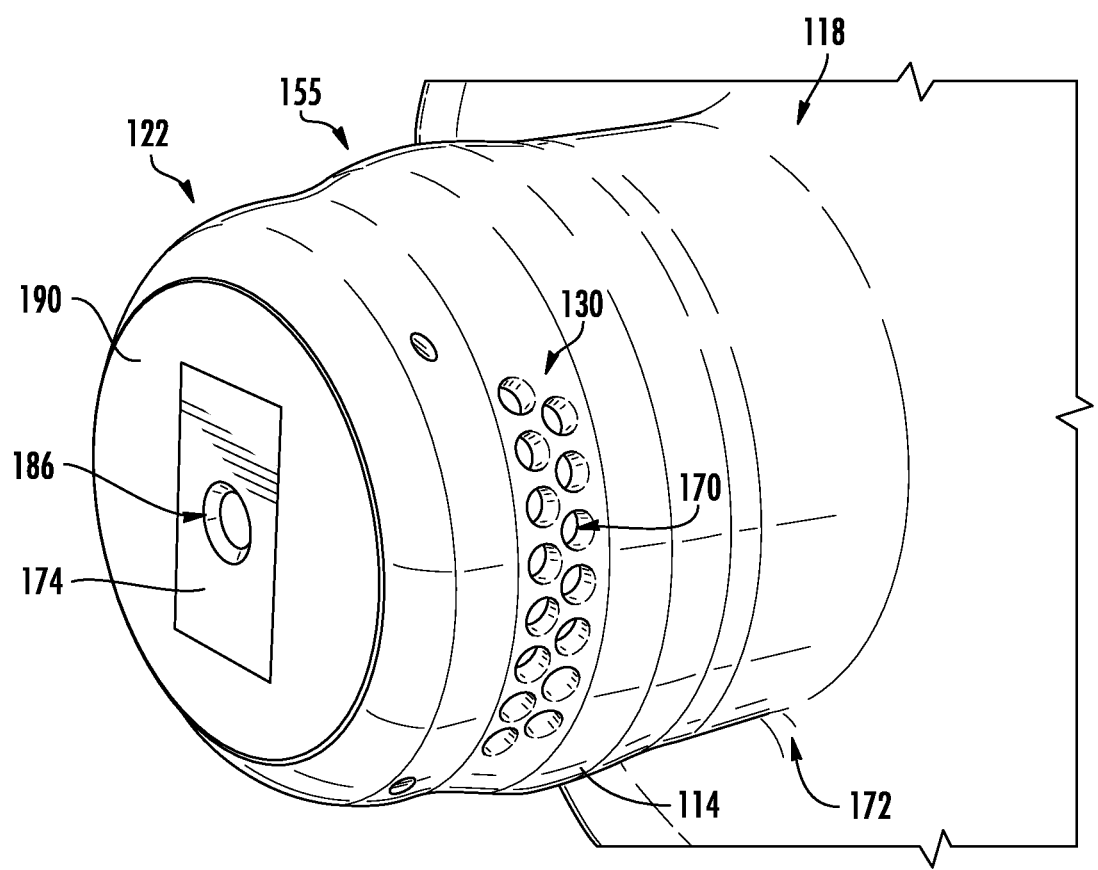
FIG. 6 is an isometric view illustrating the source housing assembly in shown in FIG. 5.

Referring now to FIGS. 5-6, a source housing assembly 155 according to another exemplary embodiment will be described in greater detail. The source housing assembly 155 includes a source housing 114 defining a proximal end 118 and a distal end 122, where the distal end 122 includes an opening 188 around an arc chamber 156. The source housing 114 further includes a set of vacuum pumping apertures 130 formed through a sidewall therein to enable vacuum pumping of the inside of the source housing 114 by a pump (not shown).

In exemplary embodiments, the arc chamber 156 is coupled to an arc base, where the arc base is coupled to an ion source body (not shown). The arc chamber 156, the arc base, and the ion source body are disposed within the source housing 114 and together generate a beam of ions for implantation into a target such as a semiconductor wafer.

The source housing assembly 155 further includes a vacuum liner 170 disposed within the interior of the source housing 114. In an exemplary embodiment, the vacuum liner 170 is positioned adjacent the vacuum pumping apertures 130 so a barrier is generated between the interior of the source housing 14 and an area 172 surrounding the source housing 114. The vacuum liner 170 is configured to allow pumping of the interior of the source housing 114, while at the same time ensuring any appendix arc produced remains enclosed inside the source housing 114. The vacuum liner 170 further ensures any ions produced outside the arc chamber 156 are prevented from escaping through the vacuum pumping apertures 130.

During operation, the arc chamber 156 may generate both a primary arc and an appendix arc. The primary arc is produced inside the arc chamber 156, and the ion beam is extracted from the primary arc through an extraction aperture 167 of the arc chamber 156. The appendix arc is produced outside the arc chamber 156 as a by-product due to the filament 64 and the arc voltage/bias voltage existing in the area.

To prevent the appendix arc and any other ions from exiting source housing 114 through the opening 188 surrounding the arc chamber 156, an extraction aperture plate 128 is coupled to an exterior surface 190 of the source housing 114. In exemplary embodiments, the extraction aperture plate 128 extends over the opening 188 and includes an opening 186 formed therein, where the opening 186 is generally aligned with the extraction aperture 167 of the arc chamber 156.

As a result, any appendix arc produced outside of the arc chamber 156 is prevented from traveling around the arc chamber 156 and exiting the source housing 114 through the opening 188. Furthermore, any ions produced outside the arc chamber 156 will also be prevented from being extracted out of the source housing 114, thus improving both beam extraction stability and beam current. Just those ions produced inside the arc chamber 156 may be extracted out of the source housing 114 through the opening 186 of the extraction aperture plate 128. Beam glitches resulting from the appendix arc may therefore be reduced.

Figure 7:
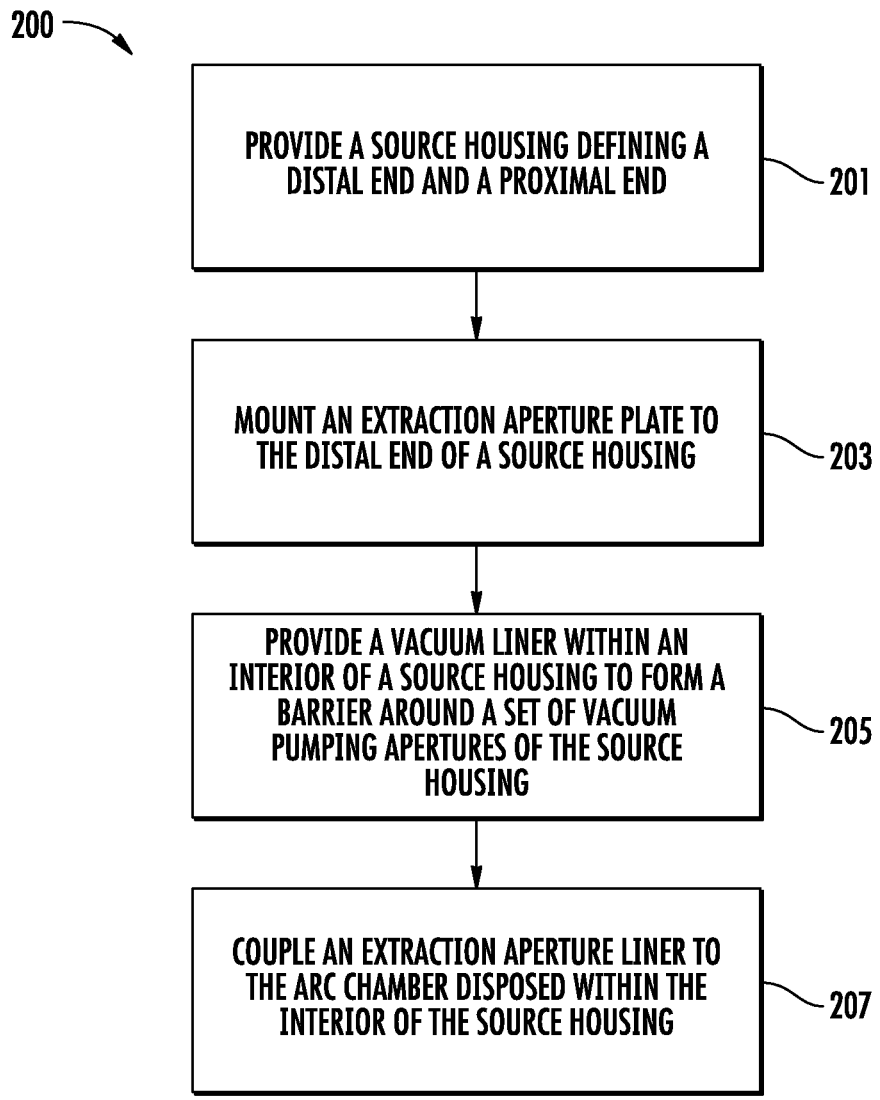
FIG. 7 is a flowchart illustrating an exemplary method according to the present disclosure.

Referring now to FIG. 7, a flow diagram illustrating an exemplary method 200 for improving ion beam extraction stability and ion beam current for an ion extraction system in accordance with the present disclosure is shown. The method 200 will be described in conjunction with the representations shown in FIGS. 1-6.

Method 200 includes providing a source housing defining a distal end and a proximal end, as shown in block 201. In some embodiments, the source housing is a part of an ion extraction system. In some embodiments, the source housing further includes a set of vacuum pumping apertures formed through a sidewall of the source housing to enable vacuum pumping of the interior of the source housing.

Method 200 further includes mounting an extraction aperture plate to the distal end of a source housing, the extraction aperture plate having an opening substantially aligned with an aperture of an arc chamber disposed within the source housing, as shown in block 203. In some embodiments, the extraction aperture plate extends over an opening in the source housing defined by the interior of the source housing at the distal end. In some embodiments, the extraction aperture plate may have an opening substantially aligned with an aperture of the arc chamber. In some embodiments, the extraction aperture plate is coupled to the source housing as an integral component, allowing the extraction aperture plate to be positioned more accurately. In some embodiments, the extraction aperture plate is coupled to an exterior surface of the source housing and is dimensioned to enclose an opening surrounding the arc chamber.

Method 200 further includes providing a vacuum liner within an interior of a source housing to form a barrier around a set of vacuum pumping apertures of the source housing, as shown in block 205. In some embodiments, the vacuum liner is a steel arcuate element, where the steel arcuate element is coupled to an interior surface of the source housing. In some embodiments, the vacuum liner is configured to allow pumping of the interior of the source housing, while at the same time ensuring an appendix arc remains enclosed inside the source housing.

Method 200 further includes coupling an extraction aperture liner to the arc chamber disposed within the interior of the source housing, as shown in block 207. In some embodiments, the extraction aperture plate is coupled to the extraction aperture liner, wherein the extraction aperture plate includes an opening substantially aligned with the extraction aperture of the arc chamber. In some embodiments, the opening in the extraction aperture plate defines a radial extension extending into an opening of the extraction aperture liner. In some embodiments, the radial extension is dimensioned so the extraction aperture plate is coupled to the extraction aperture liner, for example, via a press fit.

In view of the foregoing, at least the following advantages are achieved by the embodiments disclosed herein. Firstly, ion beam extraction stability and ion beam current are improved because any openings at a distal end of the source housing of the ion extraction system other than the opening of the extraction aperture plate aligned with the extraction aperture of the arc chamber are obstructed by the extraction aperture plate and the vacuum liner. This ensures those arcs produced outside of the arc chamber remain enclosed within the source housing and just those ions produced within the arc chamber are extracted out of the source housing through the opening of the extraction aperture plate. Secondly, the extraction aperture plate of the disclosed embodiments is provided as part of the source housing, allowing the extraction aperture plate to be positioned more accurately, thus minimizing shifting of the opening of the extraction aperture plate across source maintenance cycles. Accurate positioning of the opening of the extraction aperture plate ensures more consistent beam optics, reducing beam tuning time and beam transport loss.

While certain embodiments of the disclosure have been described herein, the disclosure is not limited thereto, as the disclosure is as broad in scope as the art will allow and the specification may be read likewise. Therefore, the above description are not to be construed as limiting, but merely as exemplifications of particular embodiments. Those skilled in the art will envision other modifications within the scope and spirit of the claims appended hereto.

The invention claimed is:

1. A source housing assembly, comprising:
    a source housing including a distal end and a proximal end;
    an ion source including an arc chamber disposed within an interior of the source housing;
    an extraction aperture plate mounted directly to an end wall defining the distal end of the source housing, the extraction aperture plate extending over an opening in the source housing defined by the interior of the source housing at the distal end, and the extraction aperture plate having an opening substantially aligned with and further defining an aperture of the arc chamber; and
    an extraction aperture liner coupled to the arc chamber, the extraction aperture liner extending along an interior surface of the extraction aperture plate, parallel to the extraction aperture plate.

2. The source housing assembly of claim 1, the extraction aperture liner having an opening substantially aligned with the extraction aperture of the arc chamber, wherein the opening of the extraction aperture liner is larger than the extraction aperture of the arc chamber.

3. The source housing assembly of claim 2, the extraction aperture plate coupled to the extraction aperture liner.

4. The source housing assembly of claim 2, the opening of the extraction aperture plate defining a radial extension extending into the opening of the extraction aperture liner.

5. The source housing assembly of claim 1, further comprising an ion source body coupled to the arc chamber within the source housing.

6. The source housing assembly of claim 1, further comprising a set of vacuum pumping apertures formed through the source housing proximate the arc chamber.

7. The source housing assembly of claim 6, further comprising a vacuum liner disposed within the source housing, the vacuum liner disposed adjacent the set of vacuum pumping apertures.

8. The source housing assembly of claim 7, the vacuum liner positioned to form a barrier between the set of vacuum pumping apertures and the arc chamber.

9. The source housing assembly of claim 1, the extraction aperture plate including a single opening.

10. An ion extraction system, comprising:
    a source housing including a set of vacuum pumping apertures formed therein;
    an ion source including an arc chamber disposed within the source housing;
    a vacuum liner disposed within an interior of the source housing, the vacuum liner forming a barrier between the set of vacuum pumping apertures and the ion source;
    an extraction aperture plate mounted directly to an end wall defining a distal end of the source housing, the extraction aperture plate extending over an opening in the source housing defined by the interior of the source housing at the distal end, and the extraction aperture plate having an opening substantially aligned with and further defining an aperture of the arc chamber; and
    an extraction aperture liner coupled to the arc chamber, the extraction aperture liner extending along an interior surface of the extraction aperture plate, parallel to the extraction aperture plate.

11. The ion extraction system of claim 10, the extraction aperture liner having an opening substantially aligned with the extraction aperture of the arc chamber, wherein the opening of the extraction aperture liner is larger than the extraction aperture of the arc chamber.

12. The ion extraction system of claim 11, the extraction aperture plate coupled to the extraction aperture liner.

13. The ion extraction system of claim 12, the opening of the extraction aperture plate defining a radial extension extending into an opening of the extraction aperture liner.

14. The ion extraction system of claim 10, further comprising a ground electrode and a suppression electrode each having an opening substantially aligned with the opening of extraction aperture plate.

15. The ion extraction system of claim 10, the vacuum liner coupled to an interior surface of the source housing adjacent the set of vacuum pumping apertures.

16. A method comprising:
providing a source housing defining a distal end and a proximal end;
mounting an extraction aperture plate directly to an end wall defining the distal end of the source housing, the extraction aperture plate extending over an opening in the source housing defined by the interior of the source housing at the distal end, and the extraction aperture plate having an opening substantially aligned with and further defining an aperture of the arc chamber;
providing a vacuum liner within an interior of a source housing, the vacuum liner forming a barrier around a set of vacuum pumping apertures of the source housing; and
coupling an extraction aperture liner to the arc chamber, the extraction aperture liner extending along an interior surface of the extraction aperture plate, parallel to the extraction aperture plate.

17. The method of claim 16, the extraction aperture liner including an opening substantially aligned with the aperture of the arc chamber, wherein the opening of the extraction aperture liner is larger than the extraction aperture of the arc chamber.

18. The method of claim 17, further comprising coupling the extraction aperture plate to the extraction aperture liner.

19. The method of claim 18, further comprising extending a radial extension of the extraction aperture plate into an opening of the extraction aperture liner.

20. The method of claim 16, further comprising coupling the vacuum liner to an interior surface of the source housing adjacent the set of vacuum pumping apertures.

* * * * *